(12) United States Patent
Chen

(10) Patent No.: US 9,082,752 B2
(45) Date of Patent: Jul. 14, 2015

(54) ELECTRONIC DEVICE

(71) Applicant: Rung-An Chen, New Taipei (TW)

(72) Inventor: Rung-An Chen, New Taipei (TW)

(73) Assignee: Foxconn Technology Co., Ltd., New Taipei (TW)

( * ) Notice: Subject to any disclaimer, the term of this patent is extended or adjusted under 35 U.S.C. 154(b) by 357 days.

(21) Appl. No.: 13/631,762

(22) Filed: Sep. 28, 2012

(65) Prior Publication Data

US 2013/0329369 A1 Dec. 12, 2013

(30) Foreign Application Priority Data

Jun. 8, 2012 (TW) .............................. 101120755 A

(51) Int. Cl.
*H05K 7/20* (2006.01)
*H01L 23/427* (2006.01)
*H01L 23/24* (2006.01)

(52) U.S. Cl.
CPC ............ *H01L 23/4275* (2013.01); *H01L 23/24* (2013.01); *H05K 7/20463* (2013.01); *H01L 2924/0002* (2013.01)

(58) Field of Classification Search
CPC .......... H05K 7/20463; H05K 7/20809; H05K 7/20936
See application file for complete search history.

(56) References Cited

U.S. PATENT DOCUMENTS

| 8,390,248 B2 * | 3/2013 | Oda et al. ....................... 320/107 |
| 2006/0196640 A1 * | 9/2006 | Siu ........................... 165/104.26 |
| 2010/0201325 A1 | 8/2010 | Oda et al. |
| 2010/0254092 A1 * | 10/2010 | Dong et al. .................... 361/705 |
| 2010/0328891 A1 * | 12/2010 | Campbell et al. ............. 361/700 |

FOREIGN PATENT DOCUMENTS

| CN | 101765964 A | 6/2010 |
| JP | 50-144581 | 11/1975 |
| JP | 58-181439 U | 12/1983 |
| JP | 10-135381 A | 5/1988 |
| JP | 10-135381 | 5/1998 |
| JP | 2012-99612 A | 5/2012 |
| WO | 2009017132 A1 | 2/2009 |

* cited by examiner

*Primary Examiner* — Gregory Thompson
(74) *Attorney, Agent, or Firm* — Novak Druce Connolly Bove + Quigg LLP

(57) ABSTRACT

An electronic device includes a circuit board, a heat generating component positioned on the circuit board, a casing receiving the circuit board and the heat generating component, and a working medium. The working medium is contained in the casing and covers the heat generating component. The working medium is electrically insulated and phase-change material, and represents solid state at normal temperature.

7 Claims, 4 Drawing Sheets

ELECTRONIC DEVICE

BACKGROUND

1. Technical Field

The present disclosure generally relates to an electronic device, and more particularly to an electronic device having a heat absorbing ability by phase changing.

2. Description of the Related Art

As electronic technology continues to advance, electronic components in an electronic device are made to provide faster operational speeds and greater functional capabilities. When an electronic component operates at a high speed for a long time, its temperature usually increases greatly. It is therefore desirable to provide a heat dissipating structure for the electronic device to remove the generated heat quickly.

A traditional heat dissipating structure is a metal radiator on a top of the electronic component of an electronic device. The radiator is arranged in a casing of the electronic device. The radiator includes a base contacting with the electronic component and a plurality of fins attached to the base. Heat generated by the electronic component is conducted into the base and dissipated to ambient air from the fins.

With respect to some electronic devices working under high loading intermittently, the time of operation under high loading is relative short than the time of standby or the time of operation under low loading. When the electronic device is operating under high loading, the heat generated by the electronic component is conducted to the air inside the casing of the electronic device quickly via the fins. This leads to a high increasing of the temperature of the casing of the electronic device in a short time and it is not comfortable for the user. When the electronic device is standby or operating under low loading, the heat generated by electronic component is less, and the fins can not be used efficiently.

Therefore, it is desirable to provide an electronic device can overcome the above problem.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present electronic device. Moreover, in the drawings, like reference numerals designate corresponding parts throughout the views.

DETAILED DESCRIPTION

Figure 1:
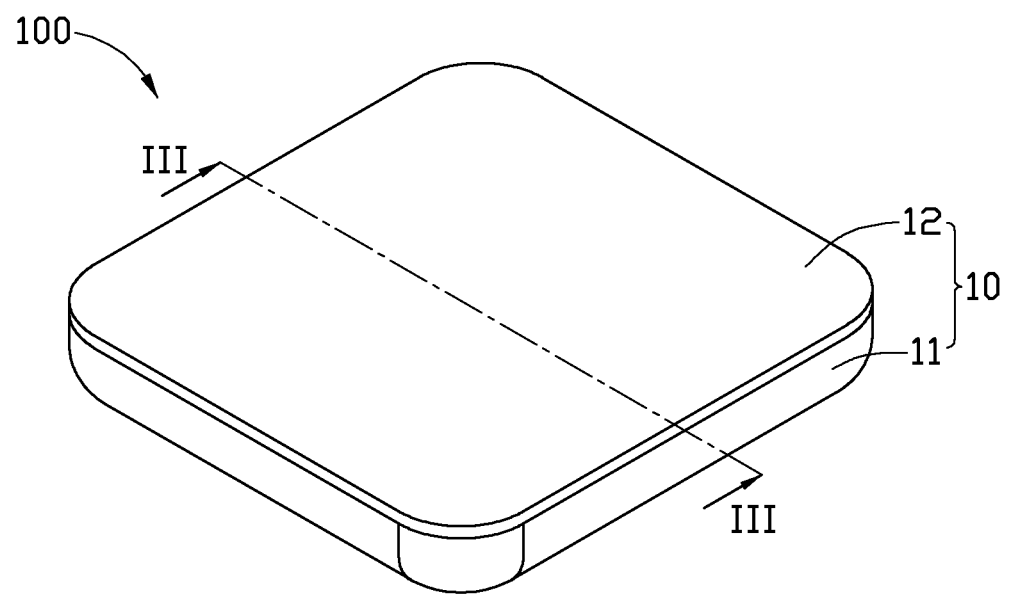
FIG. 1 is an assembled, isometric view of an electronic device in accordance with an embodiment of the disclosure.
Figure 2:
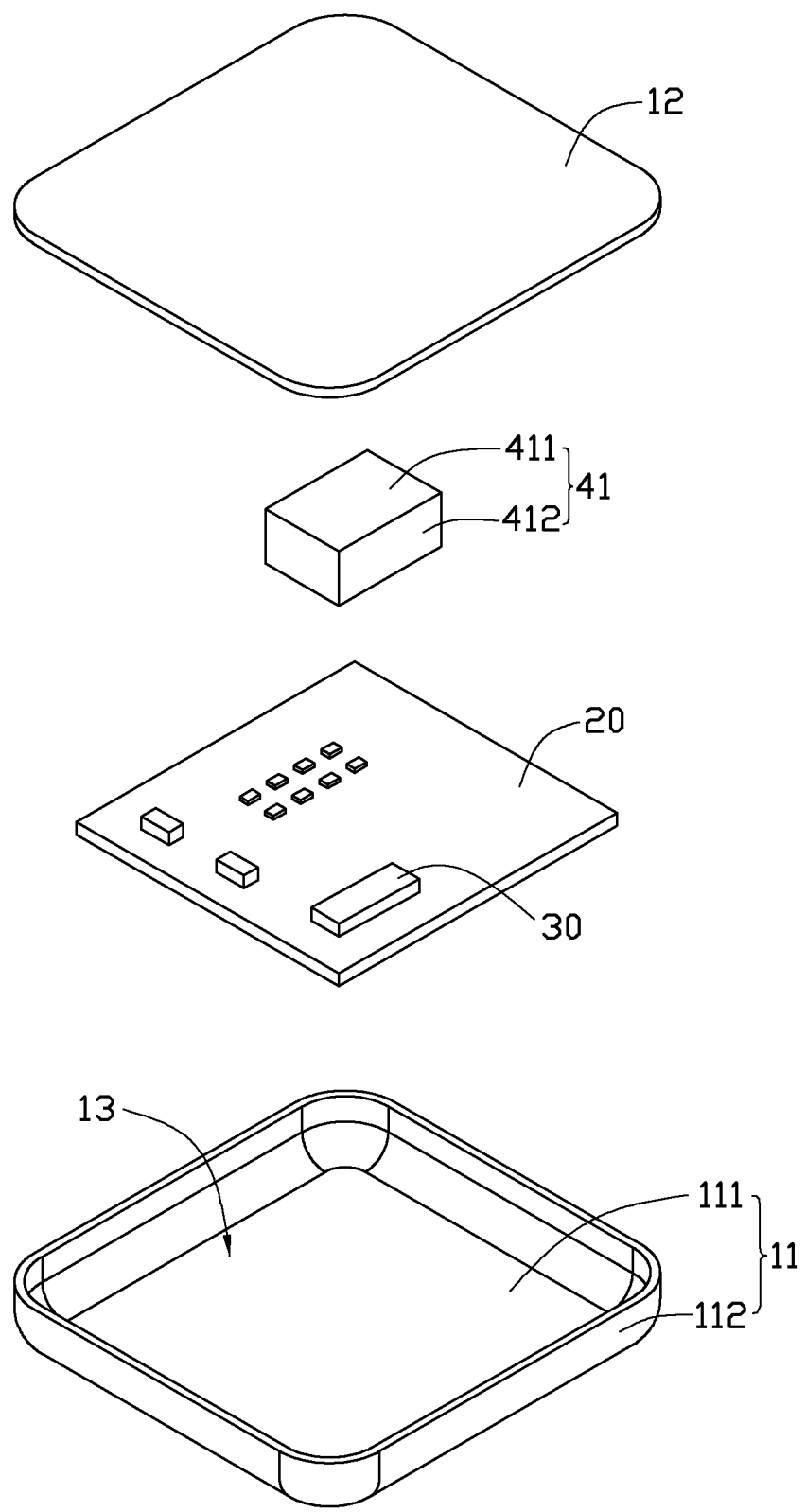
FIG. 2 is an exploded view of the electronic device of FIG. 1.
Figure 3:
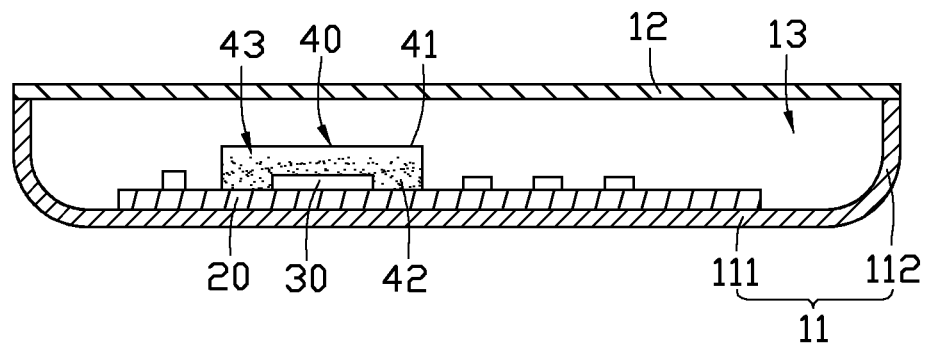
FIG. 3 is a cross sectional view of the electronic device of FIG. 1, taken along line III-III thereof.

Referring to FIG. 1 to FIG. 3, an electronic device 100 in accordance with an exemplary embodiment is provided. The electronic device 100 includes a casing 10, a circuit board 20 received in the casing 10, a heat generating component 30 and a phase change heat dissipater.

Specifically, the casing 10 includes a base 11 and a top plate 12 connected to the base 11. The base 11 includes a main body 111 and a plurality of lateral walls 112 extending upward from a periphery of the main body 111. A periphery of a bottom surface of the top plate 12 is attached to the lateral walls 112 to form a receiving space 13 for receiving related electronic components.

The circuit board 20 is disposed on the main body 111 of the base 11. The circuit board 20 is used for supporting electronic components. In this embodiment, the circuit board 20 is a printed circuit board.

The heat generating component 30 is disposed on the circuit board 20 and electrically connected to the circuit board 20.

The phase change heat dissipater 40 includes a cover 41 and a working medium 42 received in the cover 41. The cover 41 includes a top board 411 and a plurality of sidewalls 412 extending downward from a periphery of the top board 411. The top board 411 is flat. Bottom ends of the sidewalls 412 are attached to the circuit board 20 to form a cavity 43. The top board 411 and the sidewalls 412 are made from materials having good heat conductivity, such as aluminum and copper.

The working medium 42 is received in the cavity 43. The working medium 42 is electrically insulated and phase-change material, and represents solid state at normal temperature. A volume of the working medium 42 under the normal temperature is smaller than a volume of the cavity 43. The working medium 42 can be liquefied to liquid under a certain temperature which is higher than the normal temperature. A melting point of the working medium 42 is between a temperature of the heat generating component 30 under standby/low-loading state and the temperature of the heat generating component 30 under high loading state. The working medium 42 can be hydrate, organic acid or esters etc.

When assembled, the heat generating component 30 electrically connected to other components in the electronic device 100 via the circuit board 20. The cavity 43 encloses the heat generating component 30. In this embodiment, the working medium 42 covers the heat generating component 30.

When the electronic device 100 works under high-loading, heat generated by the heat generating component 30 is conducted to the working medium 42 quickly. The working medium 42 close to the heat generated component 30 are heated and liquefied to liquid firstly, then thermal convection is generated to prompt the working medium 42 relatively far from the heat generating component 30 and close to the inner surface of the cavity 43 being heated and liquefied. After that, when all of the working medium 42 is liquefied to liquid, heat are conducted to the inner surface of the cavity 43. During the process of liquefaction, most heat can be temporary stored in the working medium 42 and a little heat is conducted to the casing 10. Consequently, the surface of the heat generating component 30 is kept in a relative low temperature, and the temperature of the casing 10 is avoided rising too fast in a short time; thus, the operation of the electronic device 100 by the user is not affected.

When the electronic device 100 is under a standby status or works under low-loading, since the heat generating capacity of the heat generating component 30 is smaller than the heat dissipation capacity of the working medium 42 and the casing 10, the working medium 42 can be cooled gradually to release heat. In the above process of operation under high-loading and standby/under low-loading, the working medium 42 is used for absorbing, conducting and exchanging heat. As a dissipation medium, the working medium can be utilized fully. Due to the electrical insulation characteristic of the working medium 42, the working medium 42 will not affect the working performance of the heat generating component 30.

The shape of the top board 411 of the cover 41 is not limited to flat, it can be other shape, such as triangular pyramid. The shape of the working medium 42 can be designed according to the shape of the cavity 43 for being received in the cavity 43.

Since the working medium 42 is disposed in the cavity 43 formed by the cover 41 engaging with the circuit board 20 together, and the working medium 42 represents solid state at normal temperature. Therefore, the working medium 42 directly contacts the heat generating component 30. When the electronic device 100 works under high-loading, heat generated by the heat generating component 30 is conducted to the working medium 42 firstly, the working medium 42 is liquefied gradually for temporary storing heat. Heat is conducted to the external casing 10 slowly, and the temperature of the casing 10 is avoided rising too fast in a short time for affecting operation of the user. When the electronic device 100 is under standby stage or works under low-loading, the working medium 42 is cooling gradually to release heat. The working medium 42 gradually turns to be solid state for storing heat in temporary under a next high-loading status.

Figure 4:
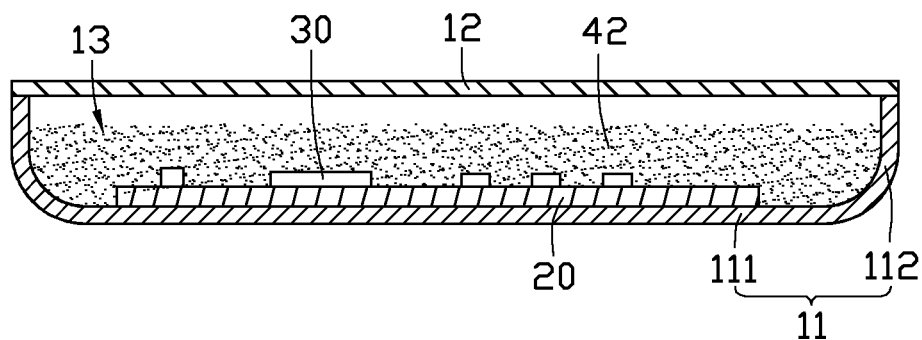
FIG. 4 is a cross sectional view of an electronic device in accordance with another embodiment of the disclosure.

Alternatively, referring to FIG. 4, the working medium 42 also can be located in the receiving space 13 between the top plate 12 and the base 11. Due to the electrical insulation characteristic of the working medium 42, the working medium 42 will not affect the working performance of the heat generating components and the circuit board 20.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An electronic device, comprising:
   a circuit board;
   a heat generating component disposed on the circuit board;
   a casing receiving the circuit board and the heat generating component; and
   a working medium contained in the casing and covering the heat generating component, the working medium being electrically insulated and phase-change material, and representing solid state at normal temperature, wherein a melting point of the working medium is between a temperature of the heat generating component under low-loading state and the temperature of the heat generating component under high-loading state, the working medium being liquefied to liquid under a certain temperature which being higher than the melting point.

2. The electronic device of claim 1, wherein the working medium is made from hydrate, organic acid or esters.

3. The electronic device of claim 1, further comprising a cover received in the casing, a cavity being formed between the cover and the circuit board, and the heat generating component and the working medium being received in the cavity.

4. The electronic device of claim 3, wherein a volume of the working medium under the normal temperature is smaller than a volume of the cavity.

5. The electronic device of claim 3, wherein the cover comprises a top board and a plurality of sidewalls extending downward from a lateral periphery of the top board, bottom ends of the sidewalls being attached to the circuit board to form the cavity.

6. The electronic device of claim 5, wherein the top board and the sidewalls are made from materials having good heat conductivity.

7. The electronic device of claim 1, wherein the working medium directly contacts the heat generating component.

\* \* \* \* \*